(12) United States Patent
Zang et al.

(10) Patent No.: US 12,501,728 B2
(45) Date of Patent: Dec. 16, 2025

(54) GLOBAL-SHUTTER PIXEL

(71) Applicant: OmniVision Technologies, Inc., Santa Clara, CA (US)

(72) Inventors: Hui Zang, San Jose, CA (US); Vincent Venezia, Los Gatos, CA (US); Cynthia Sun Yee Lee, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 501 days.

(21) Appl. No.: 17/977,837

(22) Filed: Oct. 31, 2022

(65) Prior Publication Data

US 2024/0145497 A1     May 2, 2024

(51) Int. Cl.
*H10F 39/00*     (2025.01)
*H10F 39/18*     (2025.01)

(52) U.S. Cl.
CPC ........... *H10F 39/803* (2025.01); *H10F 39/18* (2025.01); *H10F 39/8057* (2025.01); *H10F 39/807* (2025.01)

(58) Field of Classification Search
None
See application file for complete search history.

(56) References Cited

U.S. PATENT DOCUMENTS

| | | | |
|---|---|---|---|
| 9,548,328 B2 | 1/2017 | Hasegawa et al. | |
| 9,887,217 B2 | 2/2018 | Ahn et al. | |
| 10,741,593 B1 | 8/2020 | Mabuchi et al. | |
| 2014/0015013 A1 | 1/2014 | Arakawa | |
| 2014/0078359 A1 | 3/2014 | Lenchenkov et al. | |
| 2016/0111461 A1* | 4/2016 | Ahn | H10F 39/8037 257/225 |
| 2016/0381310 A1 | 12/2016 | Lenchenkov et al. | |
| 2017/0207270 A1 | 7/2017 | Chen et al. | |
| 2022/0077206 A1* | 3/2022 | Wei | H10F 39/813 |

FOREIGN PATENT DOCUMENTS

JP     2007005493 A     1/2007

* cited by examiner

*Primary Examiner* — William B Partridge
*Assistant Examiner* — Chevy J Boegel
(74) *Attorney, Agent, or Firm* — COZEN O'CONNOR

(57) ABSTRACT

A global-shutter pixel includes a semiconductor substrate that has a storage node and a photodiode region. A front surface of the substrate has a first recessed region between the photodiode region and the storage node in a first direction parallel to the front surface, and a second recessed region between the first recessed region and the storage node in the first direction. The first and second recessed regions extend into the substrate to a respective first recess-depth and a second recess-depth that exceeds the first recess-depth. The photodiode region includes (i) a first doped-section spanning a depth-range and having a first dopant concentration, and (ii) a second doped-section between the front surface and the first doped-section and having a second dopant concentration that is less than the first dopant concentration. The first doped-section includes a protrusion that extends at least partially beneath the first recessed region in the first direction.

19 Claims, 13 Drawing Sheets

GLOBAL-SHUTTER PIXEL

BACKGROUND

Camera modules in commercial products such as stand-alone digital cameras, mobile devices, automotive components, and medical devices include an image sensor. One type of image sensor is a complementary metal-oxide-semiconductor (CMOS) image sensor, which includes a semiconductor substrate that has a pixel array formed therein. The pixel array includes multiple rows of pixels. When capturing an image, each pixel produces photo-generated charge in response to illumination incident thereon. Circuitry of the image sensor converts this photo-generated charge to a digital pixel value. This exposure and readout process may be implemented by either a rolling shutter or a global shutter. A rolling-shutter image sensor exposes each pixel row sequentially, such that the reset, exposure, and readout of each pixel row is temporally staggered. A global-shutter image sensor exposes all pixel rows simultaneously.

SUMMARY OF THE EMBODIMENTS

One factor that determines image quality of global-shutter image sensors is its sensitivity to parasitic crosstalk to the pixel's storage node caused by stray light. In a global-shutter image sensor, the process of generating pixel values includes a charge-transfer period followed by an integration period. During the charge-transfer period, photo-generated charge of each pixel of the pixel array is simultaneously transferred to the pixel's storage node for temporary storage. During the integration period, image-sensor circuitry reads this photo-generated charge from the storage nodes in a row-by-row manner. During integration period, light that reaches a pixel's storage node, or immediate surroundings, generates charges that change the amount of photo-generated charge at the storage node, and hence distorts the resulting pixel value. Such light is known as parasitic light, and its effect is parasitic crosstalk.

In a first aspect, a global-shutter pixel includes a semiconductor substrate that includes a storage node and a photodiode region. A front surface of the semiconductor substrate has a first recessed region between the photodiode region and the storage node in a first direction parallel to the front surface, and a second recessed region between the first recessed region and the storage node in the first direction. The first and second recessed regions extend into the semiconductor substrate from the front surface to a respective first recess-depth and a second recess-depth that exceeds the first recess-depth. The photodiode region includes (i) a first doped-section spanning a depth-range and having a first dopant concentration, and (ii) a second doped-section between the front surface and the first doped-section and having a second dopant concentration that is less than the first dopant concentration. The first doped-section includes a protrusion that extends at least partially beneath the first recessed region in the first direction.

In a second aspect, a global-shutter pixel includes a semiconductor substrate, a dielectric fill, and a storage gate. The semiconductor substrate includes a storage node, a photodiode region, and a front surface. The front surface has a first recessed region between the photodiode region and the storage node in a first direction parallel to the front surface, and a second recessed region between the first recessed region and the storage node in the first direction. The first and second recessed regions extend into the semiconductor substrate from the front surface to a respective first recess-depth and a second recess-depth that exceeds the first recess-depth. The dielectric fill is in the first recessed region. The storage gate (i) includes a conductive fill in the second recessed region and (ii) selectively couples the photodiode region to the storage node. The photodiode region includes (i) a first doped-section spanning a depth-range and having a first dopant concentration, and (ii) a second doped-section between the front surface and the first doped-section and having a second dopant concentration that is less than the first dopant concentration. The first doped-section has a protrusion that extends at least partially beneath the first recessed region in the first direction.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples. One skilled in the relevant art will recognize, well-known structures, materials, or operations are not shown or described in detail to avoid obscuring certain aspects.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layer may also be present.

The term semiconductor substrate may refer to substrates formed of one or more semiconductors such as silicon, silicon-germanium, germanium, gallium arsenide, indium gallium arsenide, III-V group of compounds, and other semiconductor materials known to those of skill in the art. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. It should be noted that element names and symbols may be used interchangeably through this document (e.g., Si vs. silicon); both have identical meanings.

Figure 1:
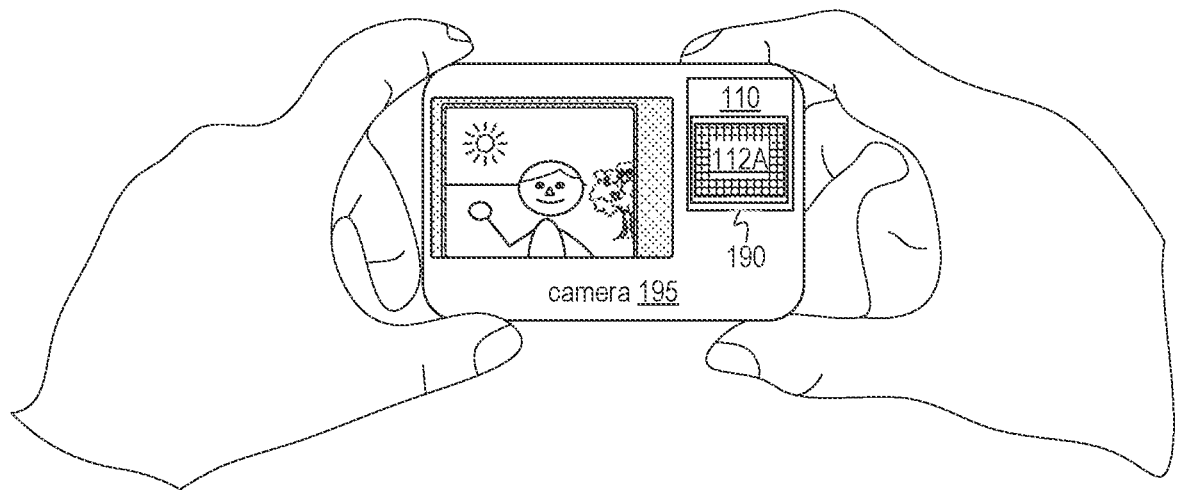
FIG. 1 depicts a camera imaging a scene; the camera includes an image sensor.

FIG. 1 depicts a camera 195 imaging a scene. Camera 195 includes an image sensor 190, which includes a semiconductor substrate 110. Constituent elements of semiconductor substrate 110 may include at least one of silicon and germanium. Semiconductor substrate 110 includes a pixel array 112A. Image sensor 190 may be part of a chip-scale package or a chip-on-board package. Camera 195 is shown as a component of a handheld device, but it should be appreciated that other devices, such as security devices, automobile cameras, drone cameras, endoscope, etc. may utilize camera 195 without departing from the scope hereof.

Figure 2:
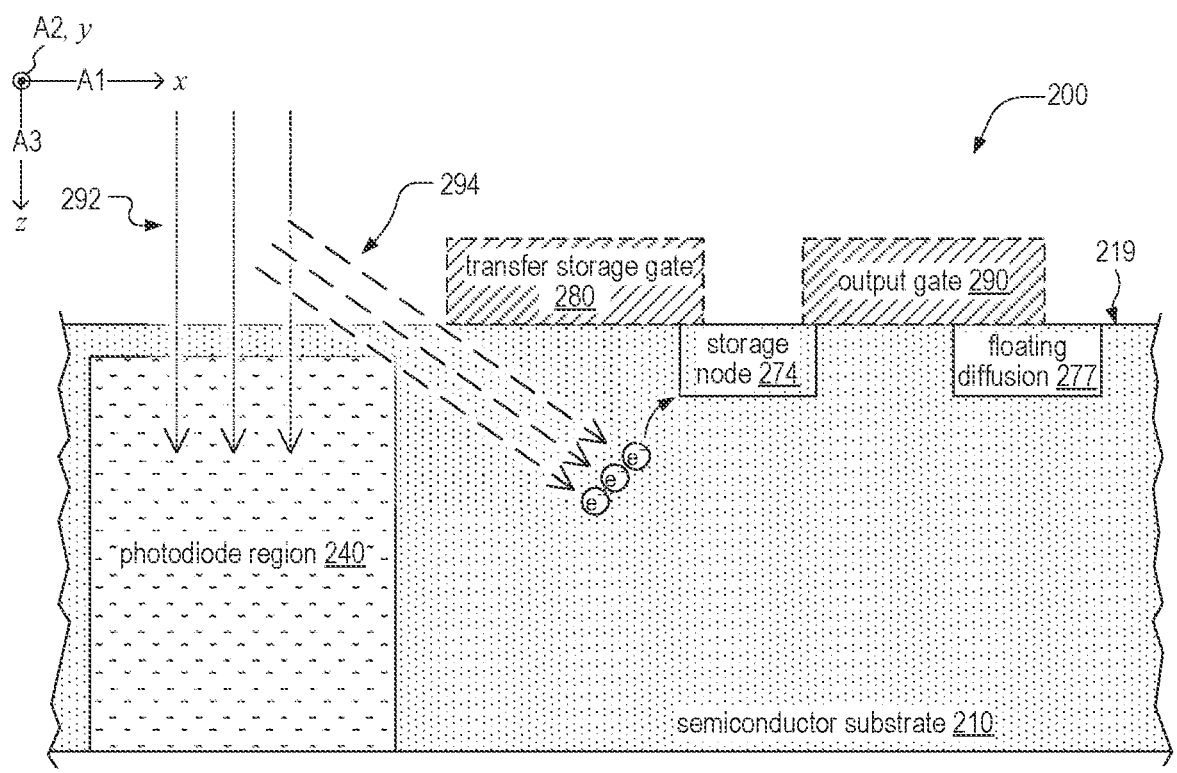
FIG. 2 is a cross-sectional schematic of parasitic crosstalk in a pixel.

FIG. 2 is a cross-sectional schematic of a pixel 200, which may be a pixel of pixel array 112A of image sensor 190. Pixel 200 includes a semiconductor substrate 210, which includes a photodiode region 240, a storage node 274, and a floating diffusion 277. Pixel 200 may also include at least one of a transfer storage gate 280 and an output gate 290 on a front surface 219 of semiconductor substrate 210. Transfer storage gate 280 electrically couples photodiode region 240 to the storage node 274, and output gate 290 electrically couples storage node 274 to floating diffusion 277. FIG. 2 illustrates illumination 292 and stray light 294 incident on pixel 200. Illumination 292 propagates at a relatively small incidence angle such that it produces photogenerated charges in photodiode region 240, which are transferred through transfer storage gate 280 and temporarily stored in storage node 274. Stray light 294 may originate from reflections in a layer (e.g., metal layer) located above semiconductor substrate 210, for example, above a photodiode of an adjacent pixel of pixel array 112A. Stray light 294 propagates at a relatively large incidence angle such that it bypasses photodiode region 240 and excites photogenerated charge at or near storage node 274. This charge drifts toward storage node 274, which results in parasitic crosstalk.

Figure 3:
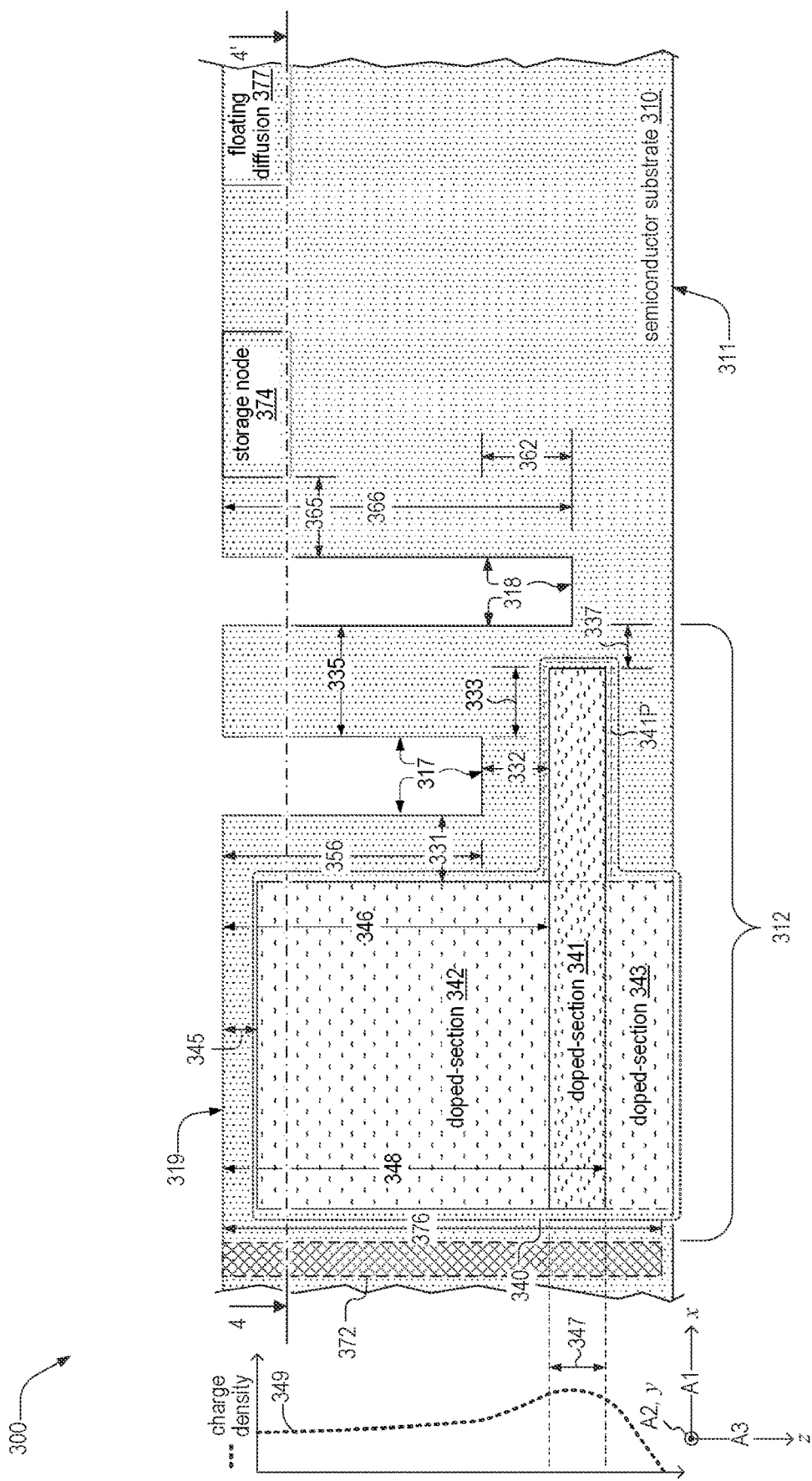
FIGS. 3 and 4 are respective cross-sectional schematics of a first embodiment of a global-shutter pixel.
Figure 4:
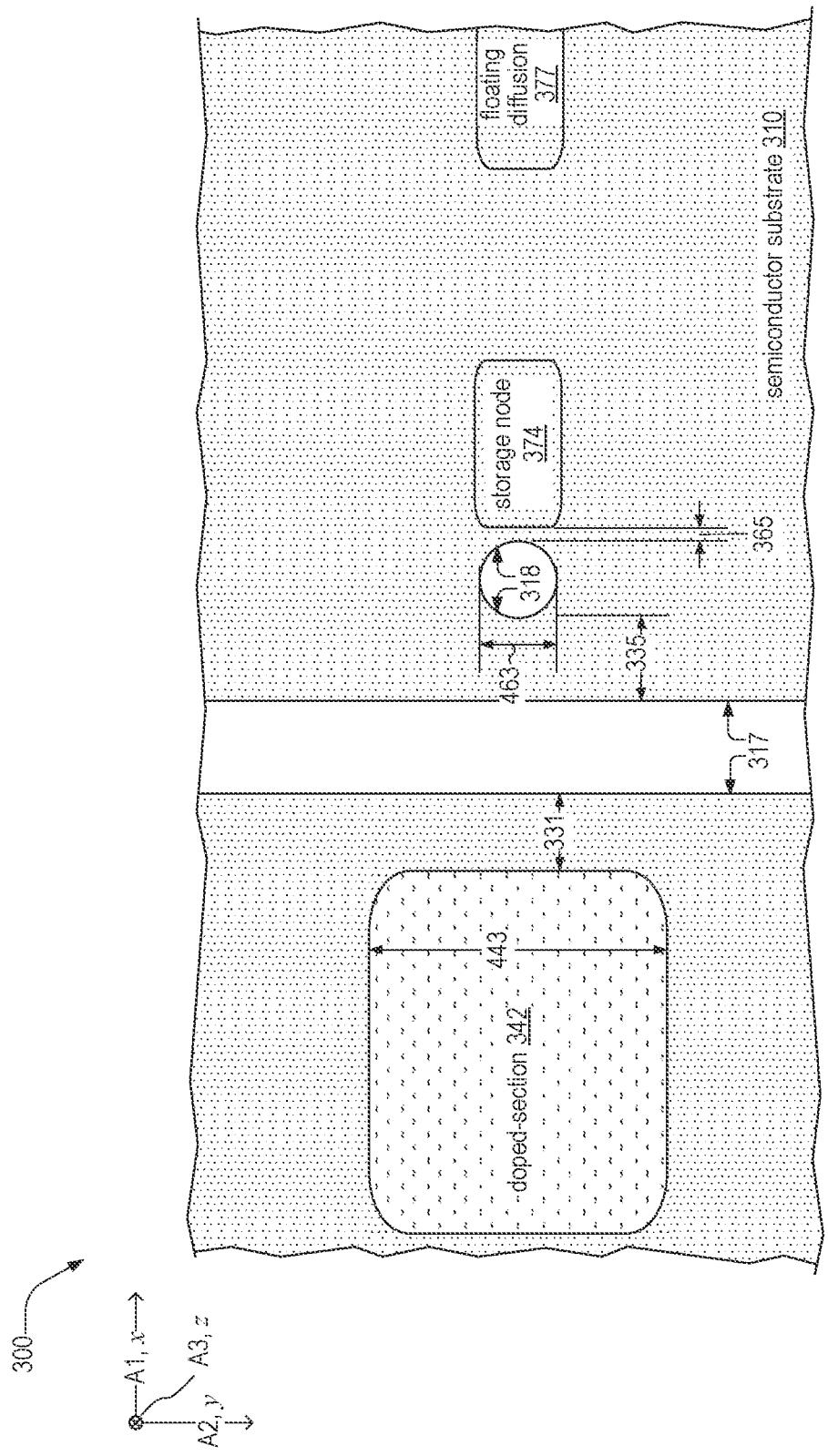

FIGS. 3 and 4 are respective cross-sectional schematics of a global-shutter pixel 300, hereinafter pixel 300. Pixel 300 may be a pixel of pixel array 112A of image sensor 190, and may be a front-side illuminated (FSI) pixel or a back-side illuminated (BSI) pixel. FIGS. 3 and 4 are best viewed together in the following description. Figures herein depict axes A1, A2, and A3. Herein, the x-y plane is formed by orthogonal axes A1 and A2, and planes parallel to the x-y plane are referred to as transverse planes. Herein, a reference to an axis x, y, or z refers to axes A1, A2, and A3, respectively. The cross-section of FIG. 3 is parallel to the x-z plane. FIG. 3 denotes a cross-sectional plane 4-4', which is parallel to the x-y plane and is the cross-sectional plane of FIG. 4. Unless otherwise specified, heights and depths of objects herein refer to the object's extent along axis A3. Also, herein, a horizontal plane is parallel to the x-y plane, a width refers to an object's extent along the x or y axis respectively, and a vertical direction is along the z axis.

Pixel 300 includes a semiconductor substrate 310, which includes a storage node 374, a floating diffusion 377, a photodiode region 340, and a front surface 319, and a back surface 311 opposite front surface 319. Axis A1 is parallel to a planar region of front surface 319. Along axis A1, front surface 319 has a recessed region 317 (first recessed region) between photodiode region 340 and storage node 374, and a recessed region 318 (second recessed region) between the recessed region 317 and storage node 374. Along axis A1, recessed regions 317 and 318 are spaced by a distance 335, which may be less than two hundred nanometers to ensure that the area of pixel 300 is not prohibitively large. Recessed regions 317 and 318 extend into semiconductor substrate 310 from front surface 319 to recess-depths 356 and 366, respectively. Recess-depth 366 exceeds recess-depth 356.

Photodiode region 340 includes a doped-section 341 and a doped-section 342, and has a minimum depth 345 with respect to front surface 319. Photodiode region 340 may also include a doped-section 343. Doped section 341 spans a depth-range 347 and has a first dopant concentration. Depth-range 347 spans between a lower dopant-depth 348 and an upper dopant-depth 346 with respect to front surface 319. Upper dopant-depth 346 is less than recess-depth 366, while lower dopant-depth 348 exceeds recess-depth 366. Upper dopant-depth 346 may exceed recess-depth 356. Along axis A1, storage node 374 and recessed region 318 are separated by a distance 365.

Along axis A2, doped-section 342 and recessed region 318 have respective widths 443 and 463. Also along axis A2, recessed region 317 has a width, which may exceed width 443 such that, when recessed region 317 is filled with a dielectric that forms a shallow-trench isolation (STI) structure, the STI structure is sufficiently wide to block stray light from reaching the storage node 374. Width 443 may also exceed width 463. Doped-section 342 begins at a depth 345 with respect to front surface 319. Depth 345 is less than the recess-depth 366.

In embodiments, semiconductor substrate 310 includes an isolation region 372 adjacent to photodiode region 340 on a side of photodiode region 340 opposite that of recessed region 317. Isolation region 372 extends from front surface 319 to an isolation depth 376 providing electrical isolation between adjacent pixels. In embodiments, part of photodiode region 340 is between isolation region 372 and recessed region 317 along axis A1. In some embodiments, the entirety of photodiode region 340 is disposed in a substrate region 312 that is between isolation region 372 and recessed region 318 and spans between surfaces 311 and 319. Isolation region 372 is a doped substrate region in the semiconductor substrate 310. Isolation region 372 and photodiode region 340 have opposite conductive types, such that isolation region 372 prevents leakage and blooming between adjacent photodiode regions 340 of adjacent pixels in an image sensor that includes an array of pixels 300. Isolation region 372 and semiconductor substrate 310 may have the same conductive type, e.g., p-type, while having a higher dopant concentration. Isolation depth 376 may exceed depth 348 to provide sufficient isolation between pixels.

Figure 5:
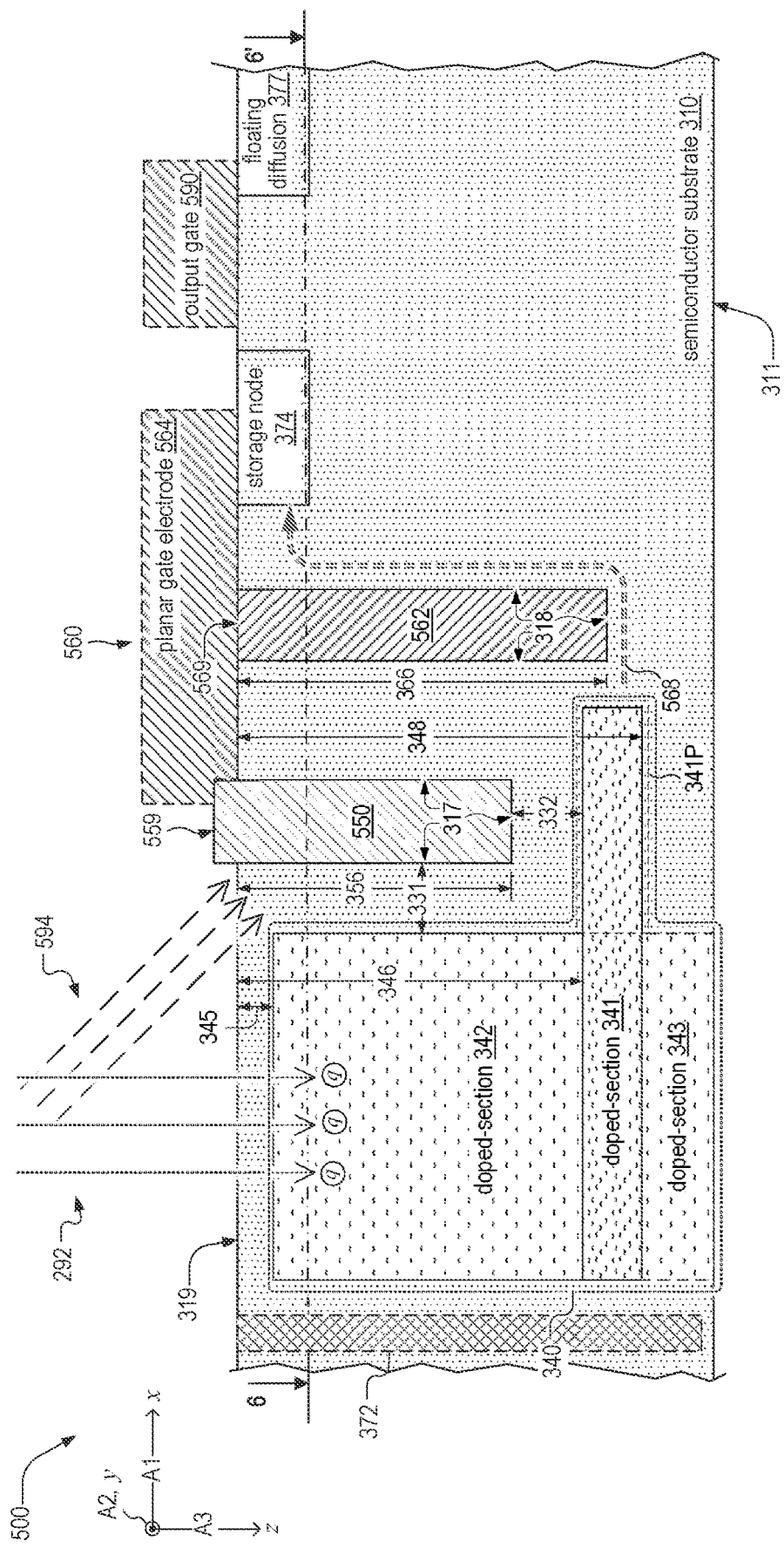
FIGS. 5 and 6 are respective cross-sectional schematics of a second embodiment of a global-shutter pixel.
Figure 6:
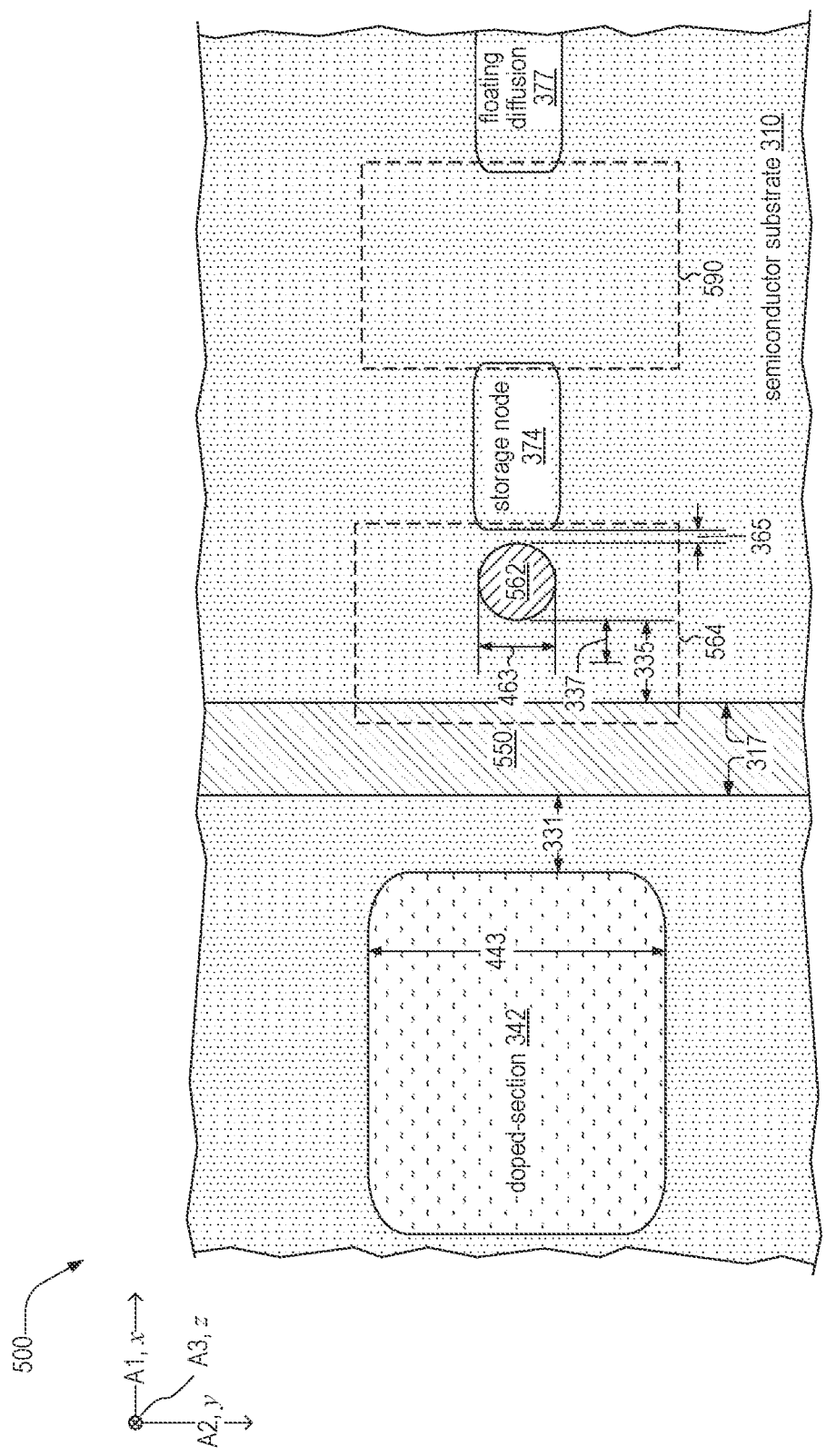

FIGS. 5 and 6 are respective cross-sectional schematics of a pixel 500. The cross-section of FIG. 5 is parallel to the x-z plane. FIG. 5 denotes a cross-sectional plane 6-6', which is parallel to the x-y plane and is the cross-sectional plane of FIG. 6. FIGS. 5 and 6 are best viewed together in the following description. It is appreciated that certain components may be omitted in FIG. 5 and FIG. 6 (e.g., color filters, microlenses, one or more layers of metal interconnect structures, contact pads, gate oxide, spacer, or the like) for clarity.

Pixel 500 is an example of pixel 300 that includes a dielectric fill 550 in recessed region 317 and a conductive fill 562 in recessed region 318. Pixel 500 may also include a planar gate electrode 564 on the front surface 319. In embodiments, recessed region 317 and dielectric fill 550 surrounds, in cross-sectional plane 6-6', at least one of conductive fill 562, planar gate electrode 564, storage node 374, and floating diffusion 377.

Conductive fill 562 and planar gate electrode 564 with a gate oxide layer (not illustrated for clarity) form a transfer storage gate 560, where conductive fill 562 functions as a vertical gate electrode. The gate oxide layer may be disposed lining sidewall and bottom surfaces of recessed region 318 between conductive fill 562 and recessed region 318, as well as between front surface 319 and planar gate electrode 564. Pixel 500 may also include an output gate 590 on front surface 319. Conductive fill 562 extends from planar gate electrode 564 toward the doped section 341 of the photodiode region 340. Distance 335 may equal zero such that no part of semiconductor substrate 310 is between dielectric fill 550 and conductive fill 562, and dielectric fill 550 adjoins conductive fill 562.

Transfer storage gate 560 may electrically couple the photodiode region 340 to storage node 374 through conductive fill 562. In operation, conductive fill 562 may electrically couple to the photodiode region 340 through doped section 341 upon receiving appropriate transfer control voltage (e.g., positive bias voltage). Output gate 590 may be a planar gate electrode disposed on front surface 319, and electrically couple storage node 374 to floating diffusion 377. In embodiments, an additional gate oxide layer may be disposed between planar gate electrode of output gate 590 and front surface 319.

Storage node 374 may be a doped region in semiconductor substrate 310 having a first junction depth with respect front surface 319 less than recess-depth 356 of recessed region 317. The first junction depth of storage node 374 is also less than upper dopant-depth 346 of doped section 341 of photodiode region 340. Floating diffusion 377 is a doped region of semiconductor substrate 310 having the same conductive type as storage node 374 and photodiode region 340. Floating diffusion 377 may have a second junction depth that is less than the recess-depth 366 of recessed region 318. The second junction depth of floating diffusion 377 may be the same as the first junction depth of the storage node 374. While planar gate electrode 564 and output gate 590 are not in cross-sectional plane 6-6', FIG. 6 depicts them for disclosure and explanatory purposes.

Dielectric fill 550 and conductive fill 562 function as a shallow-trench isolation (STI) structure and a vertical gate electrode (also referred as vertical transfer gate (VTG) 562 of transfer storage gate 560), respectively. Accordingly, dielectric fill 550 is also referred to herein as STI structure 550, and conductive fill 562 is also referred to herein as VTG 562. FIG. 5 illustrates illumination 292 and stray light 594 incident on pixel 500. Illumination 292 creates photocharges q in photodiode region 340. Stray light 594 is an example of stray light 294, which causes parasitic crosstalk in pixel 200.

At least one of STI structure 550 and VTG 562 of pixel 500 can decrease parasitic crosstalk by preventing stray light 594 from reaching parts of semiconductor substrate 310 at or near storage node 374. Having recess-depth 366 exceed recess-depth 356 allows charges accumulated in photodiode region 340 to be transferred through doped section 341 into a vertical channel region associated with VTG 562 and over to storage node 374 and, at the same time, enable VTG 562 to block at least portion of stray light 594 that bypasses STI structure 550.

Dielectric fill 550 has a front surface 559. Front surface 559 may be above surface 319, as shown in FIG. 5. Alternatively, front surface 559 may be at a depth below surface 319 that is less than or equal to depth 345 of photodiode region 340. Dielectric fill 550 may be formed of low-index material that has a refractive index lower than that of the material that forms semiconductor substrate 310. This enables total-internal reflection of stray light 594 incident on the interface between semiconductor substrate 310 and dielectric fill 550 at an angle exceeding the corresponding critical angle. Examples of materials that may form semiconductor substrate 310 are listed above in the discussion of the term semiconductor substrate. Dielectric fill 550 may be formed of an oxide-based material, such as silicon dioxide.

Conductive fill 562 has a front surface 569. Front surface 569 may be coplanar with a planar region of front surface 319 adjacent to recessed region 318, as shown in FIG. 5. Alternatively, front surface 569 may protrude above front surface 319, or be at a depth below surface 319 that is less than or equal to depth 345 of photodiode region 340.

When transfer storage gate 560 includes planar gate electrode 564, VTG 562 is electrically connected to planar gate electrode 564. Part of transfer storage gate 564 may be directly above recessed region 318, and may extend into recessed region 318. VTG 562 and planar gate electrode 564 may be formed monolithically as a single gate electrode. In such embodiments, VTG 562 refers to the part of the gate in the recess defined by recessed region 318, and planar gate electrode 564 refers to the part of the gate above front surface 319.

Doped-section 342 is between front surface 319 and doped-section 341 and has a second dopant concentration. The first dopant concentration exceeds the second dopant concentration, which creates an electric field that attracts photogenerated charge q in doped-section 342 to doped section 341. In prevent image lag, the first dopant concentration may exceed the second dopant concentration by a factor of at least two or at least three.

When photodiode region 340 includes doped-section 343, this section has a third dopant concentration that is less than the first dopant concentration, which creates in an electric field that attracts photo-generated charge in doped-section 343 to doped-section 341. The first, second, and third dopant concentrations may be average dopant concentrations within doped-sections 341, 342, and 343, respectively. Doped-sections 341, 342, and 343 may be formed in the same implantation process and have the same conductive type.

Along axis A3, photodiode region 340 has a depth-dependent dopant concentration 349, which is depicted graphically in FIG. 3. Dopant concentration 349 increases between a minimum depth 345 and a depth with respect to front surface 319 within depth-range 347, that is, between depths 346 and 348, where dopant concentration 349 reaches a maximum. In embodiments, dopant concentration 349 gradually increases between depths 346 and 348. When photodiode region 340 includes doped-section 343, dopant concentration 349 decreases, e.g., monotonically decreases, between depth 348 and back surface 311. In embodiments, dopant concentration 349 is gradually increasing between depths 346 and 348, and gradually decreasing between depth 348 and back surface 311.

Doped-section 341 includes a protrusion 341P that extends along axis A1 toward conductive fill 562, such that at least part of protrusion 341P is beneath recessed region 317. Along axis A1, protrusion 341P and recessed region 318 are separated by a distance 337 within semiconductor substrate 310. In embodiments, protrusion 341P extends fully beneath recessed region 317 such that, along axis A1, distance 337 is less than distance 335. Protrusion 341P facilitates transfer of photogenerated q charge in photodiode region 340 to storage node 374 via VTG 562. In embodiments, one or more photogenerated q charges in photodiode region 340 is transferred into channel region (e.g., vertical channel region) associated with VTG 562 through protrusion 341P of doped-section 341, and transfer to the storage node 374 when transfer storage node 374 is turned on (e.g., a positive biased) during a charge transfer operation associated with global-shutter pixel 500, for example, along a charge transfer path 568. The transferred charges in storage node 374 are transferred to floating diffusion 377 when output gate 590 is turned on during a subsequent read out operation associated with global-shutter pixel 500 to the charge transfer operation. In embodiments, charge transfer from photodiode region 340 to storage node 374 may occur simultaneously at all other pixels of an image sensor that includes an array of pixels 500, which results in a global shutter operation. Readout operations that transfer charges from storage node 374 to floating diffusion 377 may occur on a row-by-row basis.

FIGS. 3 and 4 include several spatial dimensions of global-shutter pixel 300 that are relevant to its suppression of parasitic crosstalk and measures of pixel performance. At depths less than recess-depth 356, doped-section 342 and recessed region 317 are separated by a distance 331 within semiconductor substrate 310. Distance 331 may be between one hundred nanometers and two hundred nanometers. This range balances a tradeoff between full well capacity of global-shutter pixel 300's and its dark current levels. For example, etching process for forming recessed region 317 may cause damage (e.g., plasma etching damage) to crystal lattice of semiconductor substrate 310 which would induce dark current, thus the further doped-section 342 is away from the recessed region 317, the better in dark current levels.

The following example dimensions contribute to reducing or preventing dark current while ensuring adequate charge transfer from photodiode region 340 to storage node 374: distances 332, 333, and 337. The following example dimensions may be configured based on the processing technology node e.g., 55 nm, 45 nm. Doped section 341 and protrusion 341P begin at depth 346 respect to front surface 319. Depth 346 exceeds recess-depth 356 of recessed region 317 and STI structure 550 by distance 332. In embodiments, recess-depth 366 of recessed region 318 exceeds recess-depth 356 of recessed region 317 by a distance 362. Distance 332 may be at least two hundred nanometers. Recess-depth 366 may exceed depth 346 of protrusion 341P to ensure adequate charge transfer, such that distance 362 exceeds distance 332. Distance 362 may be at least one hundred nanometers. When recess-depth 366 exceeds depth 346, it also exceeds recess-depth 356. In embodiments, distance 332 is between two hundred nanometers and three hundred nanometers. When distance 332 exceeds three hundred nanometers, charge transfer may suffer. Along axis A1, protrusion 341P extends past recessed region 317 and STI structure 550 by a distance 333, which may be at least one hundred nanometers. Also along axis A1, protrusion 341P extends to a distance 337 from recessed region 318 and VTG 562, which may be less than one hundred nanometers.

Figure 7:
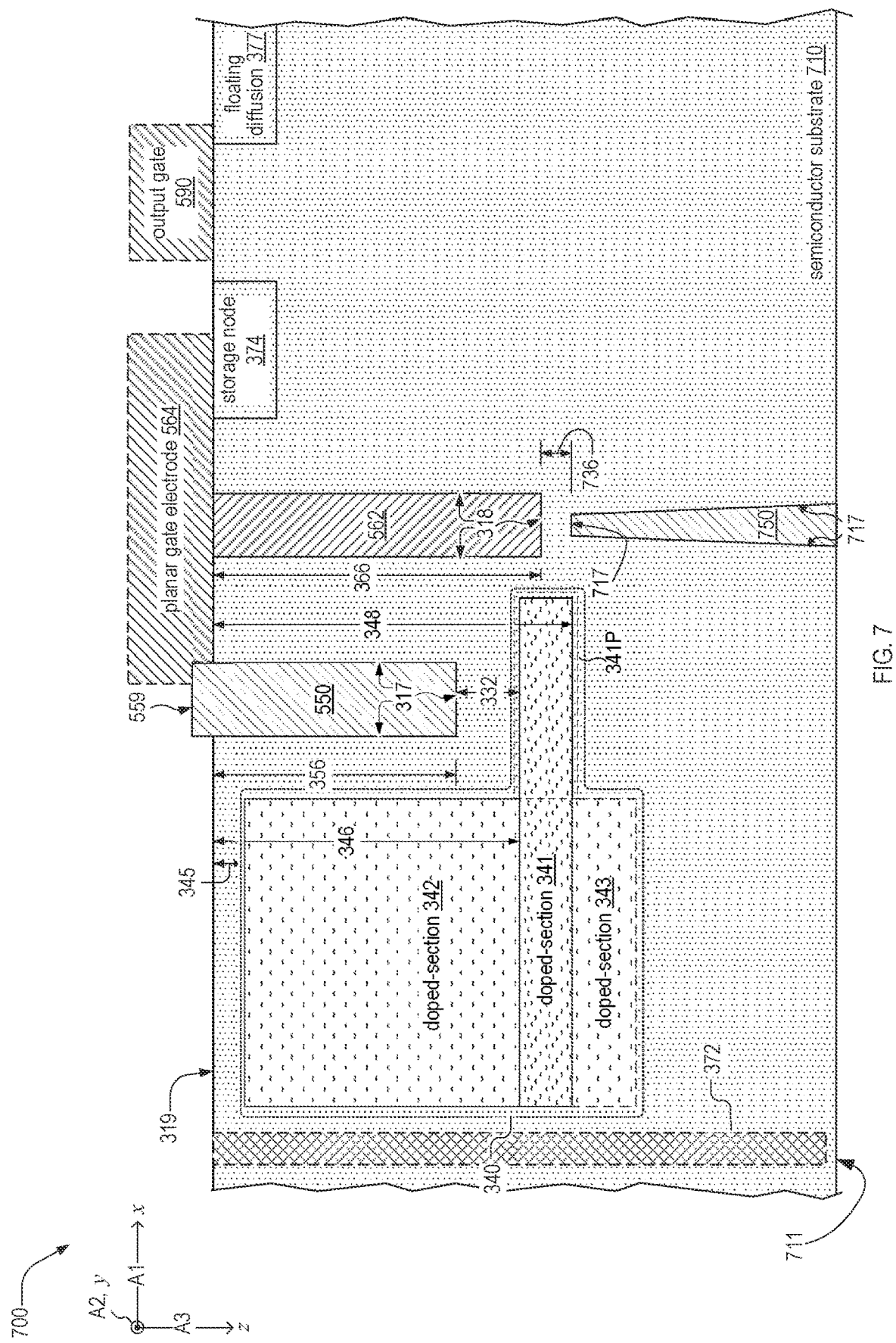
FIG. 7 is a cross-sectional schematic of a third embodiment of a global-shutter pixel.

FIG. 7 is a cross-sectional schematic of a pixel 700, which is an example of pixel 500. Pixel 700 includes a semiconductor substrate 710, which is an example of semiconductor substrate 310 that includes a back surface 711, which is an example of back surface 311. Back surface 711 includes a back-surface recessed region 717. Along axis A1, recessed region 717 is aligned with recessed region 318. A minimum distance 736 between back-surface recessed region 717 and recessed region 318 is less than a difference between the lower dopant-depth 348 and recess-depth 366. Minimum distance 736 may equal zero. Recessed region 717 may be filled with a dielectric to form a deep trench isolation (DTI) structure 750, which further enhances optical and/or electrical isolation between photodiode region 340 and storage node 374. DTI 750 may be formed of the same material is STI structure 550.

Figure 8:
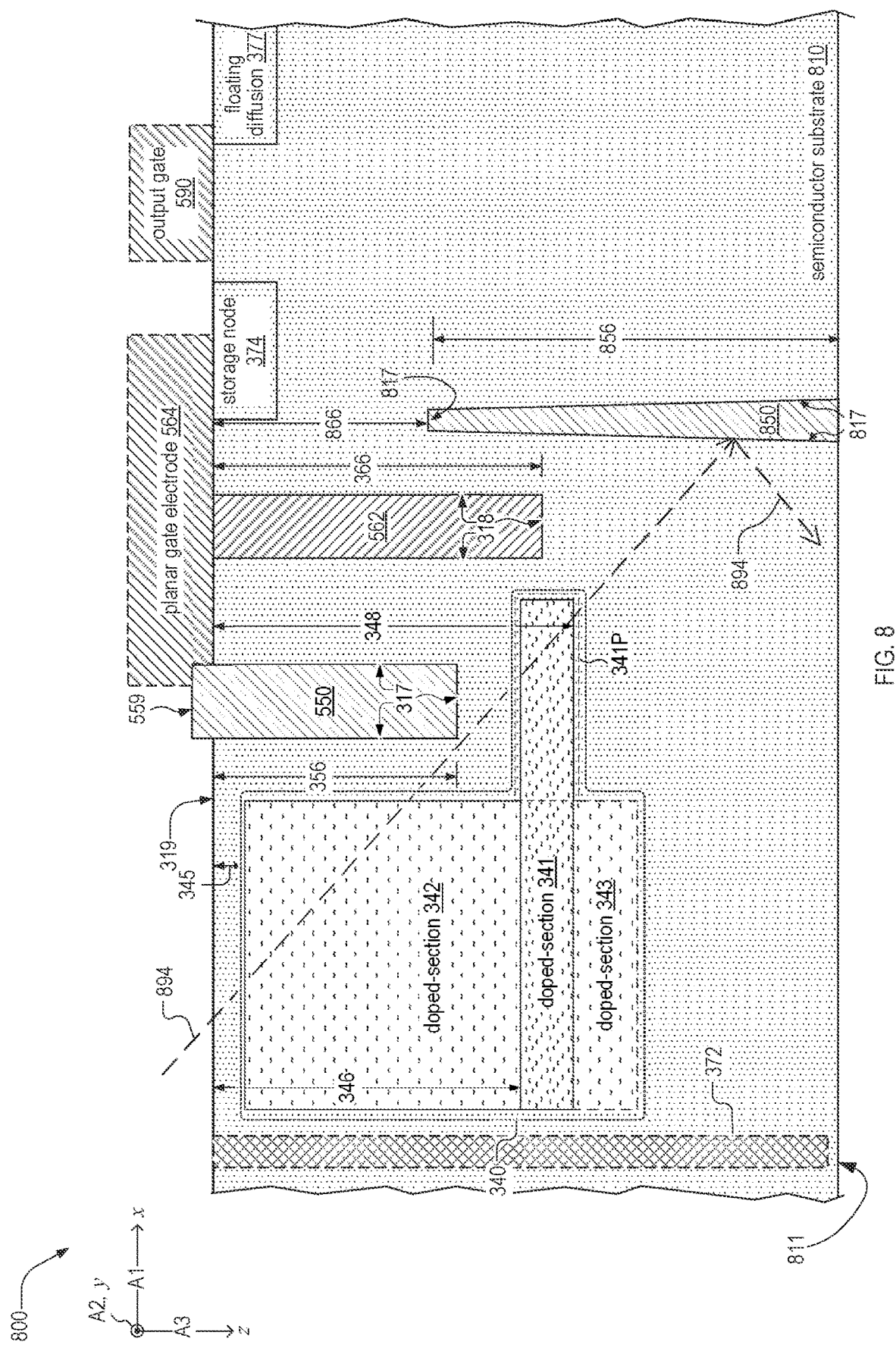
FIG. 8 is a cross-sectional schematic of a fourth embodiment of a global-shutter pixel.

FIG. 8 is a cross-sectional schematic of a pixel 800, which is an example of pixel 500. Pixel 800 includes a semiconductor substrate 810, which is an example of semiconductor substrate 810 that includes a back surface 811, which is an example of back surface 311. Back surface 811 includes a back-surface recessed region 817. A minimum distance 866 between back-surface recessed region 817 and the front surface 319 is greater than zero and less than recess-depth 366. Recessed region 817 has a depth 856 with respect to back surface 811. Depth 856 may be between 1.5 micrometers and 2.0 micrometers depending on substrate thickness (e.g., 2.5 micrometers to 6 micrometers). Along axis A1, recessed region 317 is on a first side of recessed region 318, and back-surface recessed region 817 is on a second side of recessed region 318 opposite the first side. Recessed region 817 may be filled with a dielectric to form a deep trench isolation (DTI) structure 850. FIG. 8 illustrates stray light 894 incident on pixel 800 at a relatively large angle with respect to normal incidence. Stay light 594 propagates beneath STI structure 550 and VTG 562, and is reflected by DTI structure 850.

Figure 9:
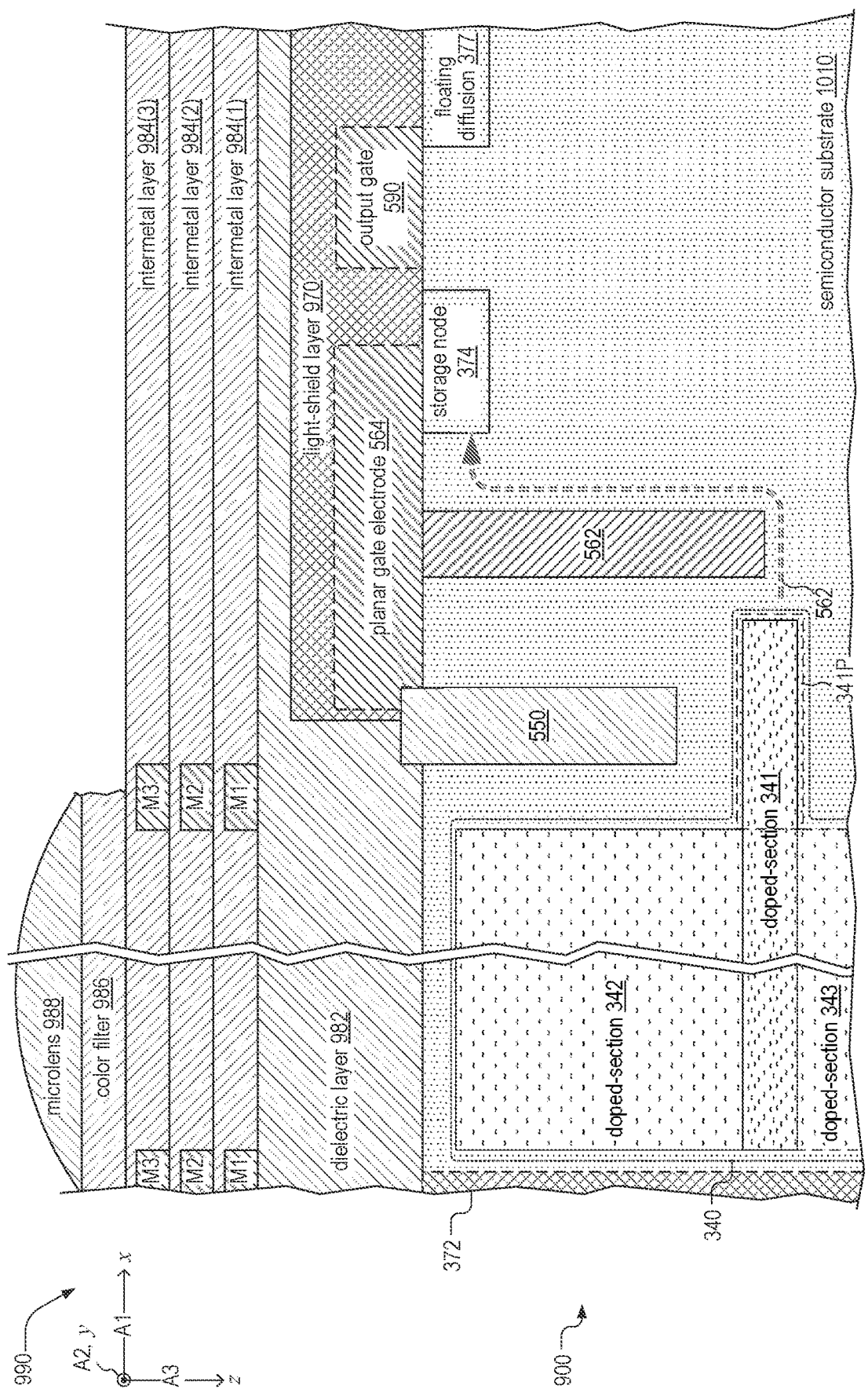
FIG. 9 is a cross-sectional schematic of a section of an image sensor, which is an example of the image sensor of FIG. 1 that includes an embodiment of the global-shutter pixel.

FIG. 9 is a cross-sectional schematic of a section of a front-side illuminated image sensor 990, which is an example of image sensor 190. Image sensor 990 includes a pixel 900, a dielectric layer 982, a light-shield layer 970, a plurality of dielectric intermetal layers 984, a color filter 986, and a microlens 988. It is appreciated that certain components may be omitted in FIG. 9 (e.g., gate oxide layer, spacer structure, electrically insulating layer, pinning layer, or the like) for clarity. Light-shield layer 970 may be embedded in dielectric layer 982, and may be formed of tungsten, aluminum, or a combination thereof. Image sensor 990 also includes metal layers M1, M2, and M3 embedded in respective intermetal layer 984(1), 984(2), and 984(3). While FIG. 9 illustrates image sensor 990 as including three intermetal layers 984, image sensor 990 may have more or fewer of said layers without departing from the scope hereof. Light-shield layer 970 also provides optical isolation to storage node 374, e.g., by blocking any light (such as stray light) from reaching storage node 374 and affecting signal charges stored therein. For example, light-shield layer 970 as illustrated may be disposed covering substrate surface region of front surface 319 associated with storage node 374 and floating diffusion 377. Although not illustrated, pixel 900 may include an electrically insulating layer between light-shield layer 970 and each of gates 560 and 590.

Pixel 900 includes a semiconductor substrate 1010, examples of which include semiconductor substrates 310, 710, and 810. Examples of pixel 900 include pixels 500, 700, and 800. Pixel 900 includes transfer storage gate 564 and output gate 590, which are encapsulated by light-shield layer 970.

Figure 10:
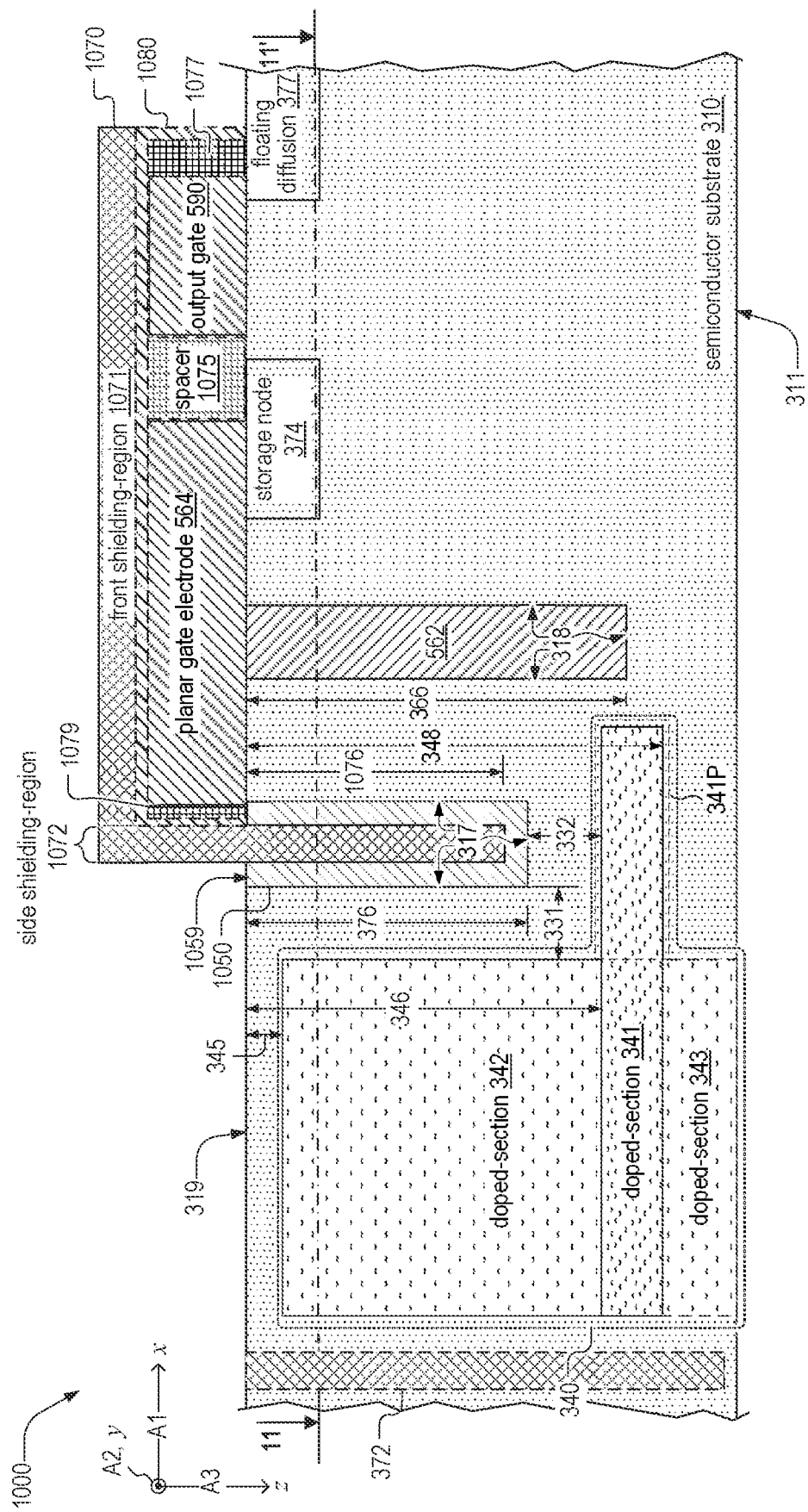
FIGS. 10 and 11 are respective cross-sectional schematics of a fifth embodiment of a global-shutter pixel.
Figure 11:
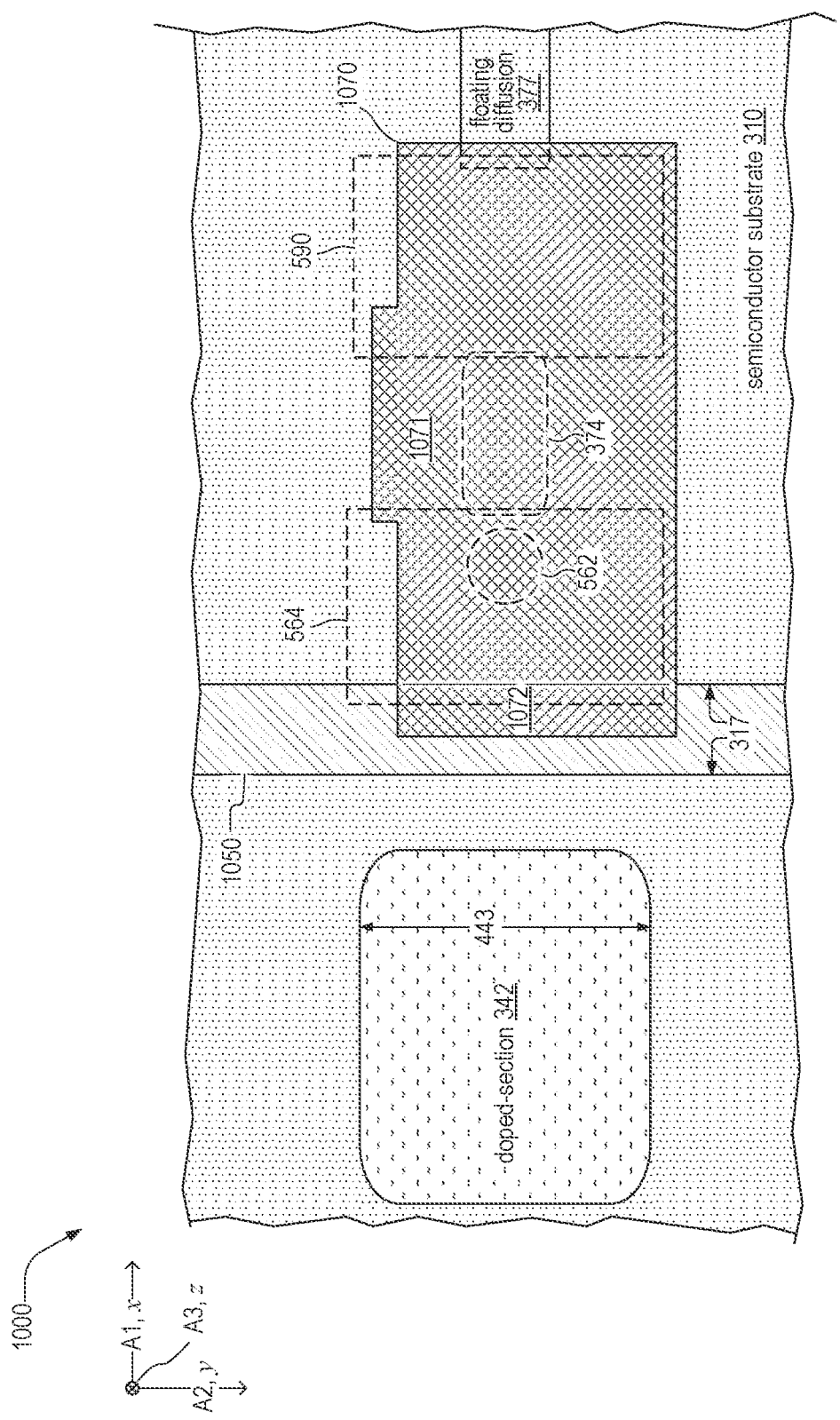
Figure 12:
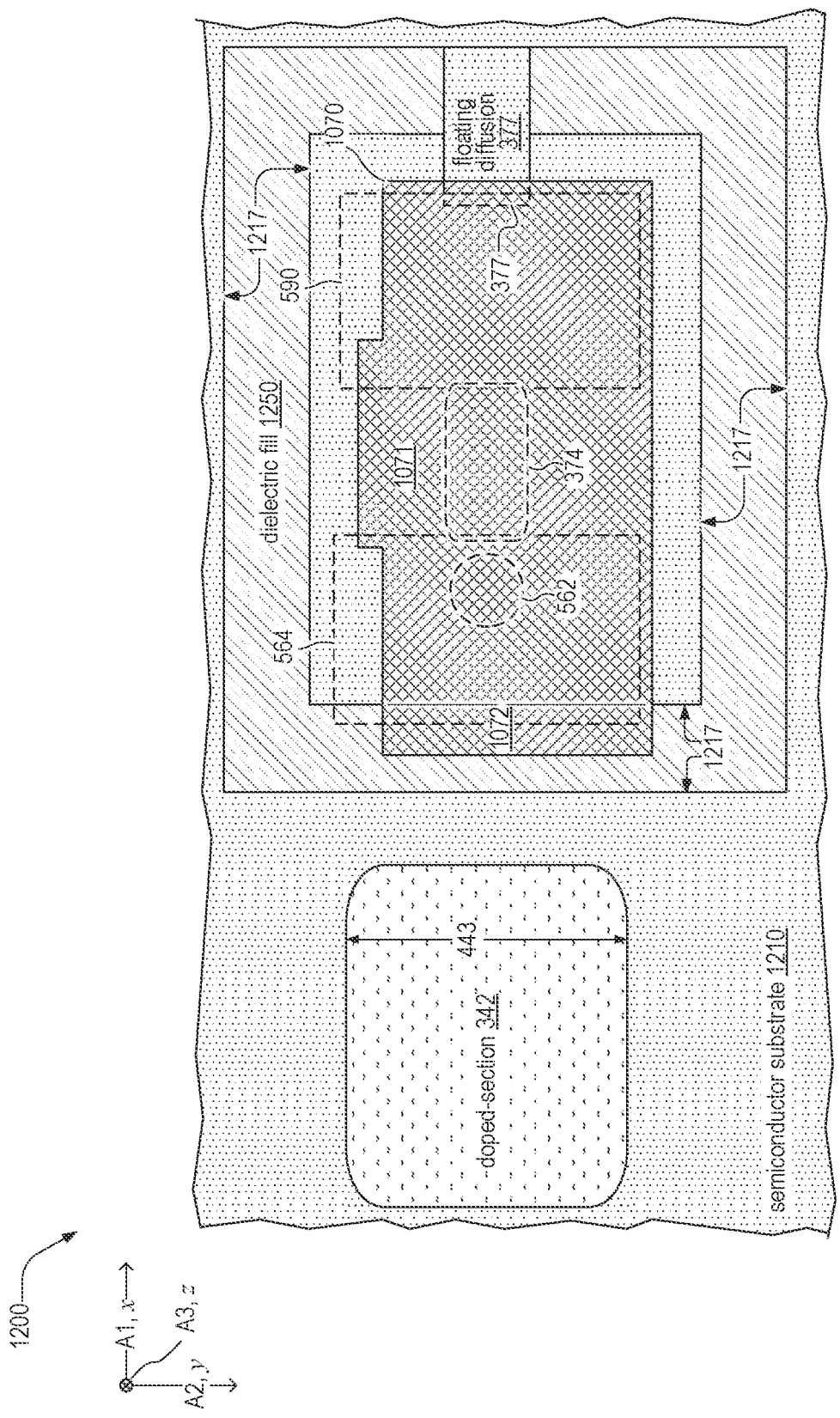
FIG. 12 is a cross-sectional schematic of a sixth embodiment of a global-shutter pixel.

FIGS. 10 and 11 are respective cross-sectional schematics of a pixel 1000. The cross-sectional plane of FIG. 10 is parallel to the x-z plane. FIG. 10 denotes a cross-sectional plane 11-11', which is parallel to the x-y plane and is the cross-sectional plane of FIG. 11. FIGS. 11 and 12 are best viewed together in the following description. While planar gate electrode 564 and output gate 590 are not in cross-sectional plane 11-11', FIG. 11 depicts them for disclosure and explanatory purposes. It is appreciated that certain components may be omitted in FIG. 10 and FIG. 11 (e.g., color filters, microlenses, one or more layers of metal interconnect structures, pinning layer, gate oxide layer, other pixel transistors for pixel 1000 or the like) for clarity.

Pixel 1000 is an example of pixel 500 that includes a light-shield layer 1070 and a dielectric fill 1050, which are respective examples of light-shield layer 970 and dielectric fill 550. Light-shield layer 1070 includes a front shielding-region 1071 and a side shielding region 1072. Front shielding region 1071 is on transfer storage gate 560, specifically, on planar gate electrode 564. Part of front shielding region 1071 may also be on output gate 590. In some embodiments, front shielding-region 1071 does not entirely cover transfer storage gate 560 and output gate 590 so as to provide space for contact landing i.e., for respective contact vias to be disposed thereon. Pixel 1000 may include an electrically insulating layer 1080 between light-shield layer 1070 and each of gates 560 and 590. Front shielding region 1071 may further encapsulate substrate surface region of front surface 319 associated with storage node 374. Side shielding region 1072 extends from front shielding-region 1071 into recessed region 317 along axis A3 such that, between back surface 311 and front surface 319, side shielding-region 1072 is surrounded by dielectric fill 1050. Along axis A1, side shielding-region 1072 is between photodiode region 340 and storage node 374.

Dielectric fill 1050 has a top surface 1059, which may be coplanar with front surface 319. With respect to top surface 1059, light shield layer 1070 extends to a depth 1076 within a trench defined by recessed region 317. Depth 1076 may be less than depth 376 and may exceed depth 345. The part of side shielding-region 1072 within said trench provides additional protection against parasitic crosstalk by preventing stray light (such as stray light 594 of FIG. 5) from reaching parts of semiconductor substrate 310 at or near storage node 374.

Pixel 1000 may also include at least one of spacers 1075, 1077, and 1079 between front surface 319 and light-shield layer 1070. Spacer 1075 is between planar gate electrode 564 and output gate 590. Spacer 1077 is adjacent to output gate 590. Spacer 1079 is between planar gate electrode 564 and side shielding region 1072 of light-shield layer 1070. At least on of spacers 1075, 1077, and 1079 is embedded in light-shield layer 1070.

FIG. 12 is a cross-sectional view of a pixel 1200, which is an example of pixel 1000 that includes a semiconductor substrate 1210 and a dielectric fill 1250. Semiconductor substrate 1210 is an example of semiconductor substrate 310 that includes a recessed region 1217, which is an example of recessed region 317. Dielectric fill 1250 is an example of dielectric fill 550, and fills recessed region 1217. Recessed region 1217 and dielectric fill 1250 surround storage node 374 and VTG 562 on a least three sides in a horizontal plane, e.g., a plane parallel to front surface 319.

Figure 13:
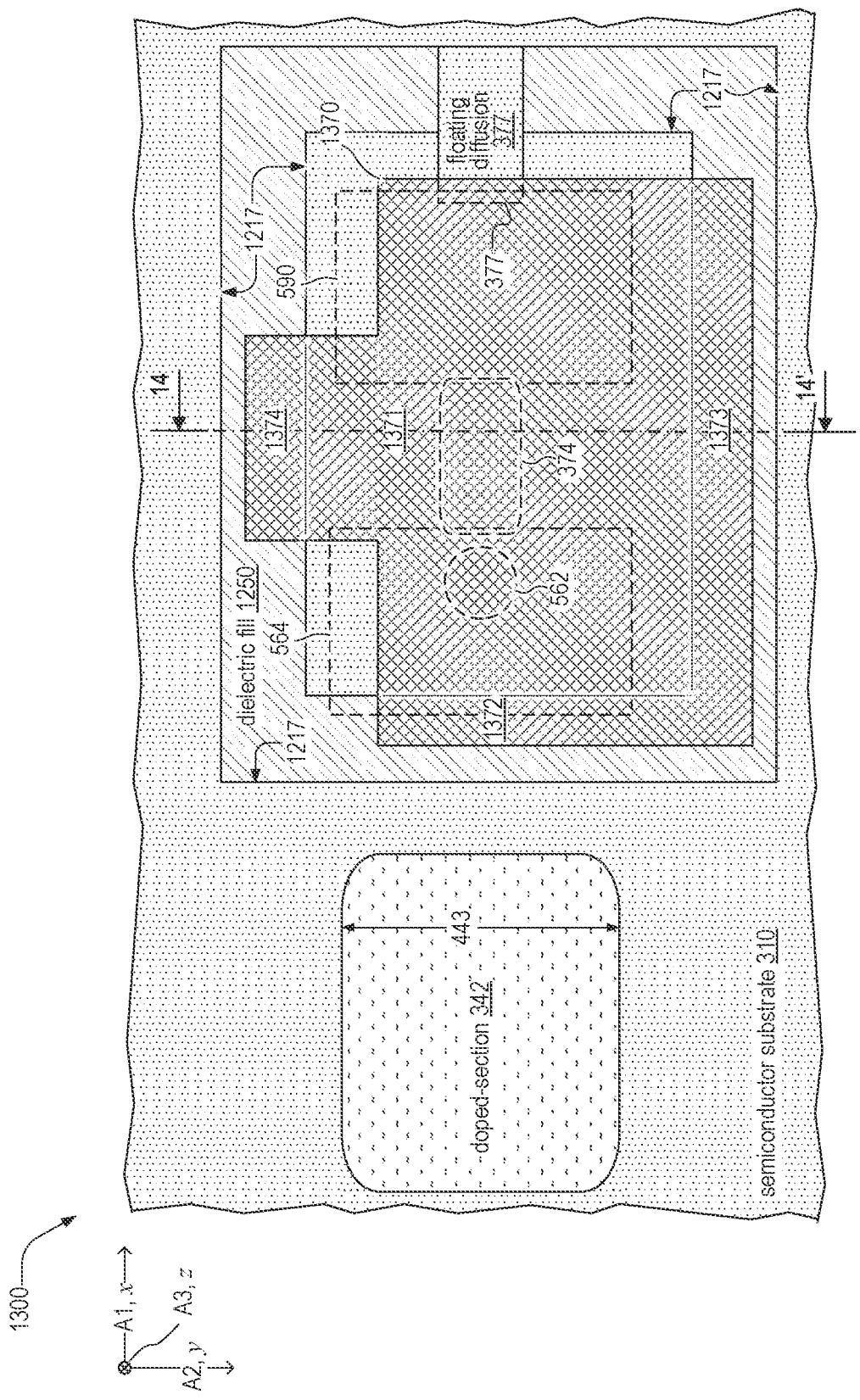
FIGS. 13 and 14 are respective cross-sectional schematics of a seventh embodiment of a global-shutter pixel.
Figure 14:
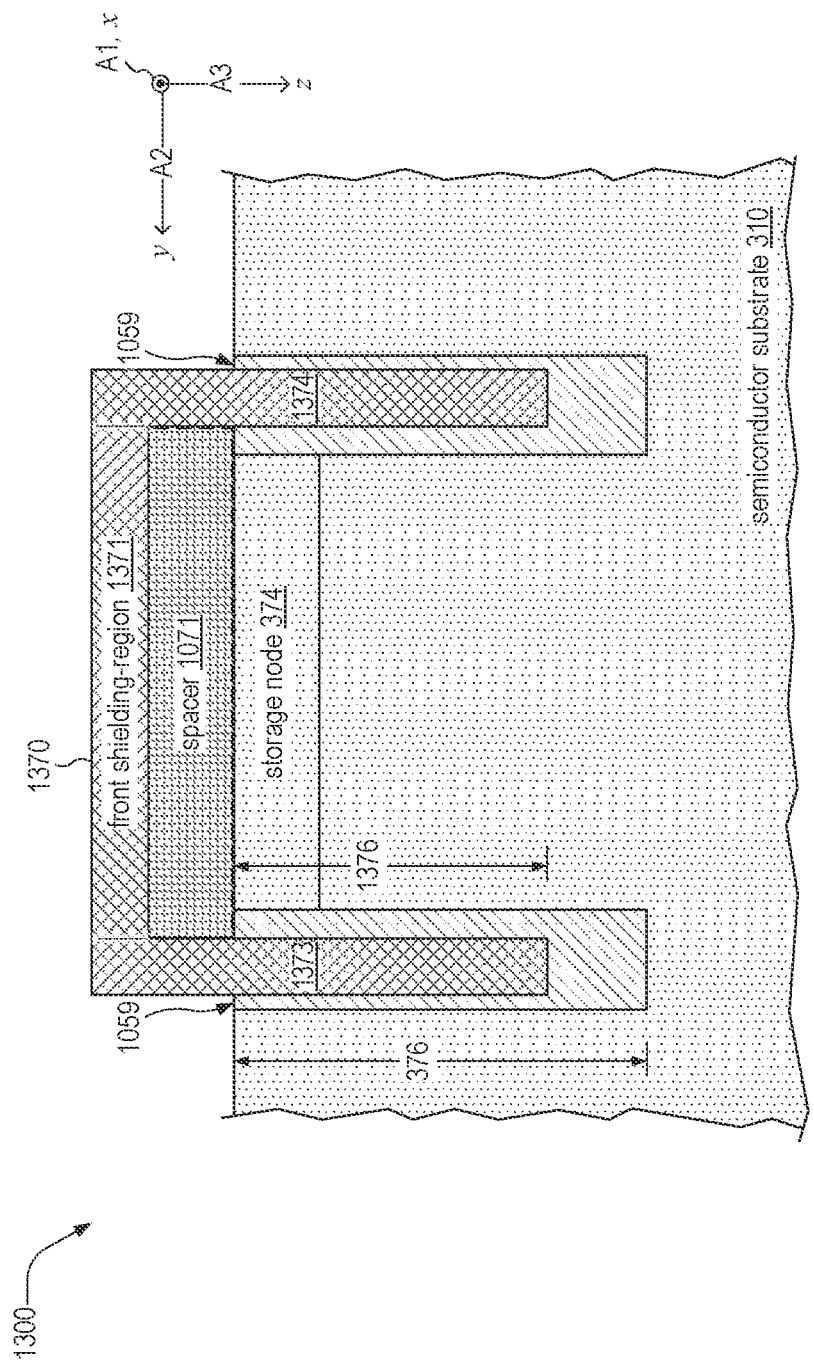

FIGS. 13 and 14 are respective cross-sectional views of a pixel 1300, which is an example of pixel 1200 that includes a light-shield layer 1370, which is an example of light-shield layer 1070. FIG. 13 denotes a cross-sectional plane 14-14', which is parallel to the y-z plane and is the cross-sectional plane of FIG. 14. FIGS. 13 and 14 are best viewed together in the following description.

Light-shield layer 1370 includes top-shielding region 1371 and side-shielding regions 1372-1374. Shielding regions 1371 and 1372 are respective examples shielding regions 1071 and 1072. FIG. 13 illustrates side-shielding region 1373 as being contiguous with side-shielding region 1372, and side-shielding region 1374 as being spatially separated from side-shielding region 1372. Top-shielding region 1371 may be disposed at least partly on planar gate electrode 564 of transfer storage gate 560 and on output gate 590. In embodiments, top-shielding region 1371 does not cover the planar gate electrode 564 and output gate 590, so as to provide space for contact landing. In embodiments, both of side-shielding regions 1373 and 1374 are contiguous with side-shielding region 1372. In other embodiments, both of side-shielding regions 1373 and 1374 are spatially separated from side-shielding region 1372.

Along axis A2, side-shielding regions 1373 and 1374 are on opposite sides of, storage node 374, such that along axis A2, storage node 374 is between side-shielding regions 1373 and 1374. Regions 1373 and 1374 result in light-shield layer 1370 having a larger extent along the A2 axis than light-shield layer 1070. Each of regions 1373 and 1374 extend along the z axis into dielectric fill 1250, as shown in FIG. 14. With respect to front surface 1059, regions 1373 and 1374 extend to a depth 1376 within recessed region 317. Depth 1376 may be less than depth 376 and may exceed depth 345 of photodiode regions 340 (not shown in FIG. 14). Regions 1373 and 1374 provide additional protection against parasitic crosstalk by preventing stray light from reaching parts of semiconductor substrate 1210 at or near storage node 374.

Combination of Features

Features described above as well as those claimed below may be combined in various ways without departing from the scope hereof. The following enumerated embodiments illustrate some possible, non-limiting combinations:

(A1) A global-shutter pixel includes a semiconductor substrate that includes a storage node and a photodiode region. A front surface of the semiconductor substrate has a first recessed region between the photodiode region and the storage node in a first direction parallel to the front surface, and a second recessed region between the first recessed region and the storage node in the first direction. The first and second recessed regions extend into the semiconductor substrate from the front surface to a respective first recess-depth and a second recess-depth that exceeds the first recess-depth. The photodiode region includes (i) a first doped-section spanning a depth-range and having a first dopant concentration, and (ii) a second doped-section between the front surface and the first doped-section and having a second dopant concentration that is less than the first dopant concentration. The first doped-section includes a protrusion that extends at least partially beneath the first recessed region in the first direction.

(A2) In embodiment (A1) the first recess-depth exceeds a junction depth of the storage node.

(A3) Either one of embodiments (A1) and (A2) further include a dielectric fill in the first recessed region and a conductive fill in the second recessed region.

(A4) Any of embodiments (A1)-(A3) further include, on the front surface, a transfer storage gate that includes a region, located above the second recessed region, that either includes or is electrically connected to the conductive fill.

(A5) Embodiment (A4) further includes a light-shield layer that includes a front shielding-region on the transfer storage gate and a side shielding-region. The side shielding-region extends, from the front shielding-region, into the first recessed region such that the side shielding-region is surrounded by the dielectric fill.

(A6) In any one of embodiments (A1)-(A5), a dopant concentration of the photodiode region increases between (i) a minimum depth of the second doped-section with respect to the front surface and (ii) a depth within the depth-range.

(A7) Any one of embodiments (A1)-(A6) further includes an isolation region adjacent to the photodiode region and extending from the front surface to an isolation depth such that a part of the photodiode region is between the isolation region and the first recessed region along the first direction.

(A8) In any one of embodiments (A1)-(A7), the depth-range spans between a lower dopant-depth and an upper dopant-depth with respect to the front surface, the upper dopant-depth being less than the second recess-depth, the lower dopant-depth exceeding the second recess-depth.

(A9) In embodiments of (A8), the semiconductor substrate has, opposite the front surface, a back surface having a back-surface recessed region aligned with the second recessed region in the first direction. A minimum distance between the back-surface recessed region and the second recessed region is less than a difference between the lower dopant-depth and the second recess-depth.

(A10) In any one of embodiments (A1)-(A9), the semiconductor substrate has, opposite the front surface, a back surface having a back-surface recessed region. A minimum distance between the back-surface recessed region and the front surface is less than the second recess-depth; and the first recessed region being on a first side of the second recessed region, the back-surface recessed region being on a second side of the second recessed region opposite the first side in the first direction.

(A11) In any one of embodiments (A1)-(A10), the second dopant concentration being less than one-half of the first dopant concentration.

(A12) In any one of embodiments (A1)-(A11), in a direction perpendicular to the front surface, the first doped-section is between the second doped-section and a third doped-section, of the photodiode region, having a third dopant concentration that is less than the first dopant concentration.

(A13) In any one of embodiments (A1)-(A12), the protrusion extends fully beneath the first recessed region such that, in the first direction, the second recessed region is closer to the protrusion than to the first recessed region.

(A14) In embodiments of (A13), in the first direction, the second recessed region is closer to the protrusion than to the first recessed region by at least one hundred nanometers.

(A15) In any one of embodiments (A1)-(A14), in a second direction parallel to the front surface and perpendicular to the first direction, a width of the first recessed region exceeds a width of the photodiode region.

(A16) In any one of embodiments (A1)-(A15), in a second direction parallel to the front surface and perpendicular to the first direction, a width of the second recessed region is less than a width of the first recessed region.

(B1) A global-shutter pixel includes a semiconductor substrate, a dielectric fill, and a storage gate. The semiconductor substrate includes a storage node, a photodiode region, and a front surface. The front surface has a first recessed region between the photodiode region and the storage node in a first direction parallel to the front surface, and a second recessed region between the first recessed region and the storage node in the first direction. The first and second recessed regions extend into the semiconductor substrate from the front surface to a respective first recess-depth and a second recess-depth that exceeds the first recess-depth. The dielectric fill is in the first recessed region. The storage gate (i) includes a conductive fill in the second recessed region and (ii) selectively couples the photodiode region to the storage node. The photodiode region includes (i) a first doped-section spanning a depth-range and having a first dopant concentration, and (ii) a second doped-section between the front surface and the first doped-section and having a second dopant concentration that is less than the first dopant concentration. The first doped-section has a protrusion that extends at least partially beneath the first recessed region in the first direction.

(B2) In embodiments of (B1), the semiconductor substrate has a greater a refractive index than does the dielectric fill.

(B3) In either one of embodiments (B1) or (B2), a dopant concentration of the photodiode region increases between (i) a minimum depth of the second doped-section with respect to the front surface and (ii) a depth within the depth-range.

(B4) Any one of embodiments (B1)-(B3) further includes an isolation region, a floating diffusion, and an output gate. The isolation region is adjacent to the photodiode region and extends from the front surface to an isolation depth such that a part of the photodiode region is between the isolation region and the first recessed region along the first direction. The floating diffusion has a second junction depth less than the isolation depth. The output gate is on the front surface and selectively couples the storage node to the floating diffusion.

(B5) In any one of embodiments (B1)-(B4), in a second direction parallel to the front surface and perpendicular to the first direction, a width of the first recessed region exceeding a width of the photodiode region.

(B6) Any one of embodiments (B1)-(B4) further include a light-shield layer that includes a front shielding-region on the storage gate and a side shielding-region that extends, from the front shielding-region, into the first recessed region such that the side shielding-region is surrounded by the dielectric fill.

(B7) In embodiment (B6) the side shielding-region is between the photodiode region and the storage node in a first direction. The first recessed region and the dielectric fill surround the storage node on a least three sides in a plane parallel to the front surface. The light-shielding layer includes a first additional side shielding-region and a second additional side shielding-region on respective opposite sides of the storage node in a second direction that is perpendicular to the first direction. Each of the first and the second additional side shielding regions extending into the first recessed region and being surrounded by the dielectric fill.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated, the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A global-shutter pixel comprising:
   a semiconductor substrate that includes a storage node, a photodiode region and a front surface having a first recessed region between the photodiode region and the storage node in a first direction parallel to the front surface, and a second recessed region between the first recessed region and the storage node in the first direction;
   the first and second recessed regions extending into the semiconductor substrate from the front surface to a respective first recess-depth and a second recess-depth that exceeds the first recess-depth;
   the photodiode region including (i) a first doped-section spanning a depth-range and having a first dopant concentration, and (ii) a second doped-section between the front surface and the first doped-section and having a second dopant concentration that is less than the first dopant concentration;
   the first doped-section including a protrusion that extends at least partially beneath the first recessed region in the first direction.

2. The pixel of claim 1, the first recess-depth exceeding a junction depth of the storage node.

3. The pixel of claim 1, further comprising a dielectric fill in the first recessed region and a conductive fill in the second recessed region.

4. The pixel of claim 3, further comprising, on the front surface, a transfer storage gate that includes a portion, located above the second recessed region, that either includes or is electrically connected to the conductive fill.

5. The pixel of claim 1, wherein a dopant concentration of the photodiode region increases between (i) a minimum depth of the second doped-section with respect to the front surface and (ii) a depth within the depth-range.

6. The pixel of claim 1, further comprising an isolation region adjacent to the photodiode region and extending from the front surface to an isolation depth such that a part of the photodiode region is between the isolation region and the first recessed region along the first direction.

7. The pixel of claim 1, the depth-range spanning between a lower dopant-depth and an upper dopant-depth with respect to the front surface, the upper dopant-depth being less than the second recess-depth, the lower dopant-depth exceeding the second recess-depth.

8. The pixel of claim 7,
   the semiconductor substrate having, opposite the front surface, a back surface having a back-surface recessed region aligned with the second recessed region in the first direction; and
   a minimum distance between the back-surface recessed region and the second recessed region being less than a difference between the lower dopant-depth and the second recess-depth.

9. The pixel of claim 1, the second dopant concentration being less than one-half of the first dopant concentration.

10. The pixel of claim 1, in a direction perpendicular to the front surface, the first doped-section being between the second doped-section and a third doped-section, of the photodiode region, having a third dopant concentration that is less than the first dopant concentration.

11. The pixel of claim 1, the protrusion extending fully beneath the first recessed region such that, in the first direction, the second recessed region is closer to the protrusion than to the first recessed region.

12. The pixel of claim 11, in the first direction, the second recessed region being closer to the protrusion than to the first recessed region by at least one hundred nanometers.

13. The pixel of claim 1, in a second direction parallel to the front surface and perpendicular to the first direction, a width of the first recessed region exceeding a width of the photodiode region.

14. The pixel of claim 1, in a second direction parallel to the front surface and perpendicular to the first direction, a width of the second recessed region being less than a width of the first recessed region.

15. A global-shutter pixel comprising:
   a semiconductor substrate that includes a storage node, a photodiode region and a front surface having a first recessed region between the photodiode region and the storage node in a first direction parallel to the front surface, and a second recessed region between the first recessed region and the storage node in the first direction;
   the first and second recessed regions extending into the semiconductor substrate from the front surface to a respective first recess-depth and a second recess-depth that exceeds the first recess-depth;
   a dielectric fill in the first recessed region; and
   a storage gate that (i) includes a conductive fill in the second recessed region and (ii) selectively couples the photodiode region to the storage node;
   the photodiode region including (i) a first doped-section spanning a depth-range and having a first dopant concentration, and (ii) a second doped-section between the front surface and the first doped-section and having a second dopant concentration that is less than the first dopant concentration;
   the first doped-section including a protrusion that extends at least partially beneath the first recessed region in the first direction.

16. The pixel of claim 15, the semiconductor substrate having a greater a refractive index than does the dielectric fill.

17. The pixel of claim 15, wherein a dopant concentration of the photodiode region increases between (i) a minimum depth of the second doped-section with respect to the front surface and (ii) a depth within the depth-range.

18. The pixel of claim 15, further comprising:
   an isolation region adjacent to the photodiode region and extending from the front surface to an isolation depth such that a part of the photodiode region is between the isolation region and the first recessed region along the first direction;
   a floating diffusion having a second junction depth less than the isolation depth; and
   an output gate on the front surface that selectively couples the storage node to the floating diffusion.

19. The pixel of claim 15, in a second direction parallel to the front surface and perpendicular to the first direction, a width of the first recessed region exceeding a width of the photodiode region.

* * * * *